United States Patent
Kamio

(10) Patent No.: US 10,582,651 B2
(45) Date of Patent: Mar. 3, 2020

(54) COMPONENT MOUNTING MACHINE

(71) Applicant: FUJI CORPORATION, Chiryu-shi (JP)

(72) Inventor: Ryohei Kamio, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 205 days.

(21) Appl. No.: 15/535,205

(22) PCT Filed: Dec. 25, 2014

(86) PCT No.: PCT/JP2014/084368
§ 371 (c)(1),
(2) Date: Jun. 12, 2017

(87) PCT Pub. No.: WO2016/103413
PCT Pub. Date: Jun. 30, 2016

(65) Prior Publication Data
US 2017/0347506 A1 Nov. 30, 2017

(51) Int. Cl.
*H05K 13/08* (2006.01)
*G05B 19/404* (2006.01)
*H05K 13/04* (2006.01)

(52) U.S. Cl.
CPC ......... *H05K 13/089* (2018.08); *G05B 19/404* (2013.01); *H05K 13/0408* (2013.01)

(58) Field of Classification Search
CPC .. H05K 13/08; H05K 13/089; H05K 13/0408; G05B 19/404
See application file for complete search history.

(56) References Cited

U.S. PATENT DOCUMENTS 5,105,368 A * 4/1992 Alexandersen ........ B25J 9/1692
700/254

FOREIGN PATENT DOCUMENTS

EP 2066166 A1 * 6/2009 ......... H05K 13/0404
JP 2004-186308 A 7/2004

OTHER PUBLICATIONS

International Search Report dated Feb. 10, 2015 in PCT/JP2014/084368 filed Dec. 25, 2014.

* cited by examiner

*Primary Examiner* — Livius R. Cazan
(74) *Attorney, Agent, or Firm* — Oblon, McClelland, Maier & Neustadt, L.L.P.

(57) ABSTRACT

A component mounting machine provided with multiple component transfer devices each have a mounting nozzle, a movable section and an XY driving mechanism and perform a component mounting operation, and a control device that controls component mounting operation and performs thermal correction processing that reduces influence of thermal deformation accompanying temperature change of at least one of the movable section and the XY driving mechanism, in which the control device has an implementation period determination section that individually determines an implementation period of the thermal correction processing for each of the component transfer devices based on operation circumstances of each component transfer device, and a thermal correction implementation section that simultaneously performs thermal correction processing for the multiple component transfer devices when it is determined that the implementation period of the thermal correction processing is reached for either of the component transfer devices by the implementation period determination section.

6 Claims, 6 Drawing Sheets

| | Temperature rank R | Permissible time (minutes) | Rank operation |
|---|---|---|---|
| Thermal correction up table | 1 | T1=5 | Raise to rank 2 |
| | 2 | T2=10 | Raise to rank 3 |
| | 3 | T3=15 | Raise to rank 4 |
| | 4 | T4=20 | Raise to rank 5 |
| | 5 | T5=30 | Raise to rank 6 |
| | 6 | T6=30 | No action taken |

| Thermal correction down table | Stopped duration (minutes) | Rank operation |
|---|---|---|
| | T11=0~3 | No action taken |
| | T12=3~5 | Lower by one rank |
| | T13=5~10 | Lower by two ranks |
| | T14=10~ | Return to rank 1 |

COMPONENT MOUNTING MACHINE

TECHNICAL FIELD

The present application relates to a component mounting machine that is provided with multiple component transfer devices.

BACKGROUND ART

A solder printing machine, a component mounting machine, a reflow machine, a board inspection machine, and the like are provided as equipment that produces a board on which multiple components are mounted. It is typical to constitute a board production line with the equipment connected in one row. Such component mounting machines are typically provided with a component transfer device that collects components from a component supply device and mounts the components on a board that is loaded on a board conveyance device. In recent years, operation of component transfer device has been getting faster in order to improve production efficiency. However, there is a problem in that the component mounting operation is influenced when a configuring member rises in temperature and is thermally deformed due to high speed operation. One technique to counter this problem is disclosed in PTL 1.

The component mounting apparatus in PTL 1 is provided with an X-Y robot that mounts a component on a board, a board recognition camera that is provided on the X-Y robot and images a fiducial mark on the board, and a control device that performs correction of the component mounting position based on positional information of the fiducial mark that is obtained by the board recognition camera imaging the fiducial mark. Thereby, it is possible to suppress a reduction of precision of the component mounting position by correcting influence of thermal expansion and contraction of the X-Y robot (thermal correction processing). Furthermore, the thermal correction processing is carried out in the embodiment, when a defined time from the start of operation has elapsed, for example, 20 minutes, 40 minutes, or 60 minutes, and when a stopped state continues for a fixed time, for example, 20 minutes.

CITATION LIST

Patent Literature

PTL 1: JP-A-2004-186308

SUMMARY

Note that, in a case where the technique in PTL 1 is carried out in a component mounting machine that is provided with two facing component transfer devices (X-Y robots), an implementation period of the thermal correction process is individually managed for each component transfer device. When two component transfer devices are operated, operation circumstances such as waiting time for component replenishment when there is component shortage, or stop time caused by a device error and maintenance, are different for each device. Therefore, in a case where component mounting operation is performed by multiple component transfer devices with respect to one board, a large amount of time is lost and production efficiency is reduced.

Describing in detail: ordinarily, multiple components that are mounted on one board are evenly distributed between the two component transfer devices, and high production efficiency is maintained by operating both component transfer devices with almost no wait. But, when mounting operation of one component transfer device is interrupted to perform thermal correction processing, the other component transfer device is wastefully in standby for the amount of time that is necessary for the thermal correction processing. As a result, the required production time of the board is prolonged and there is lost time for the amount of the time that is necessary for the thermal correction processing. Here, when the implementation periods of thermal correction processing for two component transfer devices are individually managed, implementation times are not the same, and lost time is generated two times. For example, there are cases where the thermal correction processing is performed for one component transfer device when production of a certain board starts, and the thermal correction process is performed for the other component transfer device when production of a subsequent board starts. Thereby, lost time occurs for each of the two boards, and production efficiency is reduced. In this case, if the thermal correction processing of the two component transfer devices is simultaneously performed when production of the certain board starts, lost time only occurs once.

In addition, PTL 1 discloses carrying out the thermal correction processing at regular intervals from the start of operation, but this not necessarily appropriate as a determination method of the implementation period. Typically, after the component transfer device starts to operate, the temperature of configuring members rises with a steep gradient. After that, the gradient of the temperature rise gradually becomes gentle as the operating time gets longer and finally settles at a stable temperature rise value. Accordingly, with a regular interval, thermal correction processing is not performed at a sufficient frequency after the operation has started, and unnecessary thermal correction processing is performed as the operating time gets longer, thus reducing production efficiency.

The present disclosure is carried out in consideration of the problems of the background art described above and an object thereof is to provide a component mounting machine that curtails a reduction of production efficiency by simultaneously performing thermal correction processing for multiple component transfer devices and furthermore, curtails a reduction of production efficiency by optimizing an implementation period of thermal correction processing.

A component mounting machine of the disclosure is provided with multiple component transfer devices that each have a mounting nozzle that holds and releases a component, a movable section that supports the mounting nozzle, and an XY driving mechanism that drives the movable section in an X-axis direction and a Y-axis direction in a horizontal plane, the component transfer devices performing a component mounting operation for collecting the component from a component supply device and mounting the component on a positionally aligned board, and a control device that controls the component mounting operation that is performed by the multiple component transfer devices on one board sequentially positionally aligned by the board conveyance device and performs a thermal correction processing that reduces influence of thermal deformation on the component mounting operation of each of the component transfer devices accompanying temperature change of at least one of the movable section and the XY driving mechanism, in which the control device has an implementation period determination section that individually determines an implementation period of the thermal correction processing for each of the component transfer devices based on operation circumstances of each component transfer device, and a thermal correction implementation section that simultaneously performs the thermal correction processing for the multiple component transfer devices when it is determined by the implementation period determination section that the implementation period of the thermal correction processing has been reached for either of the component transfer devices.

In the component mounting machine of the disclosure, when it is determined by the implementation period determination section that the implementation period of the thermal correction processing has been reached for either of the component transfer devices, a thermal correction implementation section simultaneously performs the thermal correction processing for the multiple component transfer devices. Therefore, lost time where component mounting operation for multiple component transfer devices is interrupted by thermal correction processing being performed overlaps and effectively only occurs once. With conventional techniques, because the implementation period of the thermal correction processing is individually managed for multiple component transfer devices, lost time is generated multiple times. Accordingly, according to the present disclosure, it is possible to reduce lost time and curtail reduction of production efficiency.

DESCRIPTION OF EMBODIMENTS

1. Configuration and Operation Mode of Component Mounting Machine 1

Figure 1:
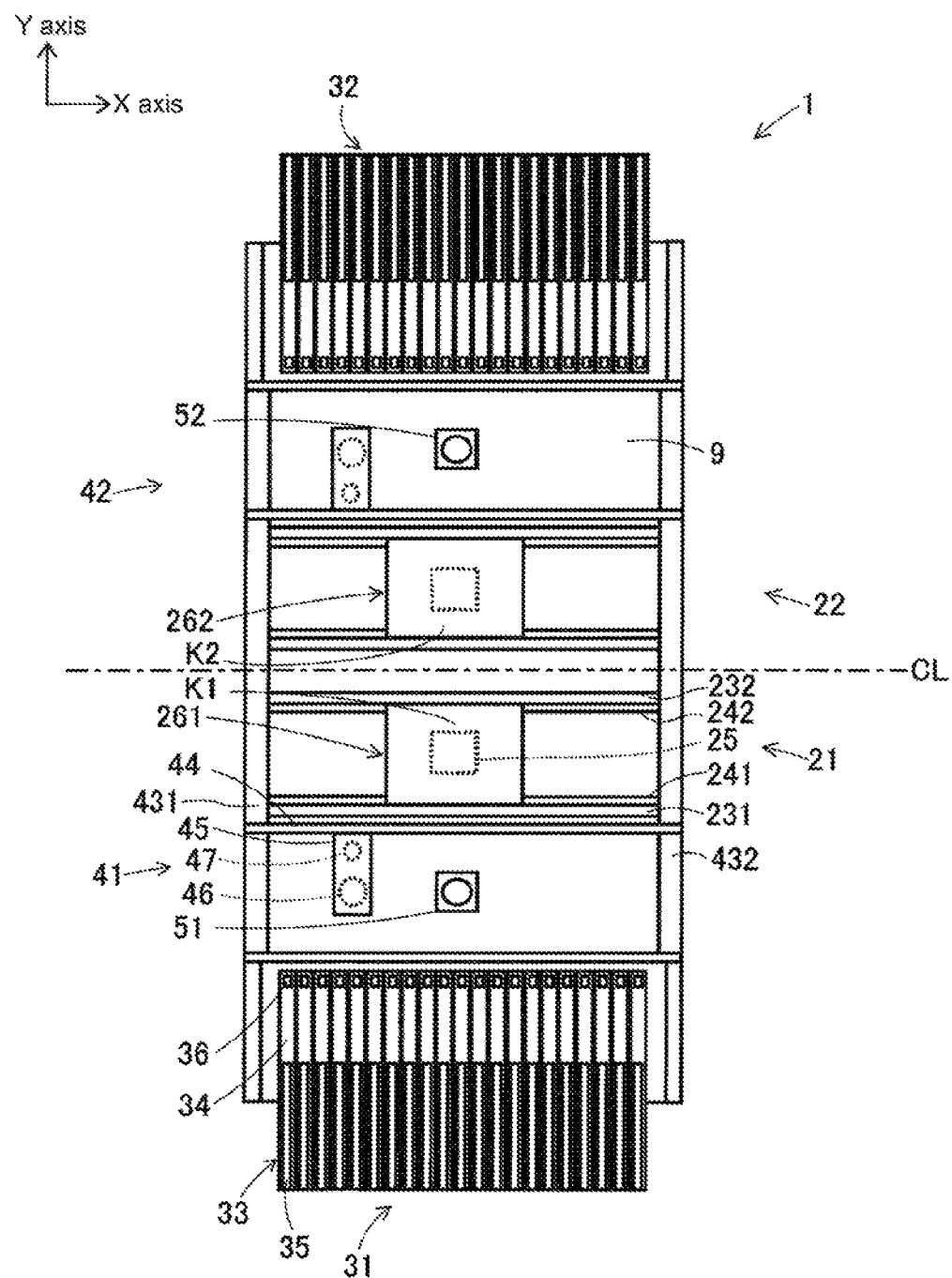
FIG. 1 is a plan view illustrating a configuration of a component mounting machine of an embodiment of the present disclosure.

A configuration of component mounting machine 1 of an embodiment of the present disclosure will be described with reference to FIG. 1. FIG. 1 is a planar view illustrating the configuration of component mounting machine 1 of an embodiment of the present disclosure. The direction from the left side toward the right side of the paper surface in FIG. 1 is an X-axis direction along which a board K is conveyed. The direction from the lower side toward the upper side of the paper surface is a Y-axis direction that is a longitudinal direction of component mounting machine 1. Component mounting machine 1 is a dual lane dual head type that is configured such that the same constituent elements are disposed at both sides of a center line CL that extends in the X-axis direction.

Component mounting machine 1 is configured by combining first and second board conveyance devices 21 and 22, first and second component supply devices 31 and 32, first and second component transfer devices 41 and 42, first and second component recognition cameras 51 and 52, a control device omitted from the drawings, and the like with device table 9. For convenience, "first" is given to constituent elements that are disposed on the paper surface lower side on the center line CL in FIG. 1 and "second" is given to constituent elements that are disposed on the paper surface upper side on the center line CL. Hereinafter, the constituent elements that are given "first" are representatively described and detailed description of the constituent elements that are given "second" are omitted.

The first board conveyance device 21 is constituted by a pair of guide rails 231 and 232, a pair of conveyor belts 241 and 242, clamping device 25, and the like. The pair of guide rails 231 and 232 are assembled on device table 9 extending in the X-axis direction and parallel to each other. The endless ring pair of conveyor belts 241 and 242 are disposed inside facing each of the pair of guide rails 231 and 232. The pair of conveyor belts 241 and 242 rotate in a state in which both ends of a first board K1 are respectively placed and the first board K1 is carried in and carried out to a first mounting execution position 261 that is set in the center in the X-axis direction. Clamping device 25 is provided below the first mounting execution position 261. Clamping device 25 pushes up and clamps the first board K1 with a horizontal posture and positionally aligns the board at the first mounting execution position 261. Thereby, the first and second component transfer devices 41 and 42 perform the component mounting operation at the first mounting execution position 261.

The first component supply device 31 is disposed close to an end portion of device table 9 in the longitudinal direction (Y-axis direction). The first component supply device 31 is configured such that multiple feeder devices 33 are arranged in the X-axis direction. Each feeder device 33 has main body section 34, supply reel 35 that is provided at a rear portion of main body section 34, and component pickup section 36 that is provided on a front upper end portion of main body portion 34. An elongated tape, which is not shown in the drawings, along which multiple components are stored at a predetermined pitch is wound and held in supply reel 35. The tape is repeatedly fed at the predetermined pitch, the components in a storage state are released and sequentially supplied to component pickup section 36. Note that, some or all of the multiple feeder devices 33 may be replaced by a component supply device of another type, for example, a tray type component supply device.

First component transfer device 41 is an XY robot type device that is movable horizontally in the X-axis direction and the Y-axis direction. First component transfer device 41 is constituted by a pair of Y-axis rails 431 and 432, Y-axis slider 44, head holder 45, an XY driving mechanism that is omitted from the drawings, and the like. The pair of Y-axis rails 431 and 432 are disposed on both sides in the X-axis direction of device table 9, and upper sides of the first and second board conveyance devices 21 and 22 extend in the Y-axis direction. The pair of Y-axis rails 431 and 432 are shared by the first and second component transfer devices 41 and 42. A long Y-axis slider 44 is mounted on the Y-axis rails 941 and 942 in the X-axis direction. Y-axis slider 44 is driven in the Y-axis direction by a Y-axis servomotor and a Y-axis ball screw feed mechanism that are omitted from the drawings.

Head holder 45 is mounted on Y-axis slider 44. Head holder 45 is driven in the X-axis direction by an X-axis servomotor and an X-axis ball screw feed mechanism that are omitted from the drawings. Head holder 45 has mounting head 46 and board recognition camera 47 on the lower face. Mounting head 46 supports one or multiple mounting nozzles (omitted from the drawings) that hold and release the component. First component transfer device 41 collects the component from component pickup section 36 of feeder device 33 and performs component mounting operation in which the collected component is mounted on the first board K1 that is positionally aligned at the first mounting execution position 261. Board recognition camera 47 images a fiducial mark that is provided on the first board K1 and detects a correct position of the first board K1.

Furthermore, each Y-axis slider 44 of the first and second component transfer devices 41 and 42 passes the center line CL alternately and is able to enter the opposite side. Accordingly, the first component transfer device 41 is able to perform the component mounting operation not only on the first board K1, but also a second board K2 that is positionally aligned at a second mounting execution position 262 of the second board conveyance device 22. In the same manner, the second component transfer device 42 is able to perform the component mounting operation not only on the second board K2, but also the first board K1. The control device that controls the component mounting operation performs control such that there is no interference between both Y-axis slider 44 and mounting head 46.

First component recognition camera 51 is provided upward on an upper face of device table 9 between first board conveyance device 21 and first component supply device 31. First component recognition camera 51 images the state of the component that is collected on the mounting nozzle while mounting head 46 moves from first component supply device 31 to the first board K1 or the second board K2. When either a difference of suction posture or deviation of rotation angle of the component according to captured image data of first component recognition camera 51 is determined, the control device performs control to finely adjust the component mounting operation according to need or discard the component in a case where mounting is difficult.

The control device not shown in the drawings holds a mounting sequence relating to the component mounting operation. The mounting sequence includes information on the type of component that is mounted on the first and second boards K1 and K2, mounting coordinate values, mounting order, position of feeder device 33 that supplies the component, and the like. The control device controls the component mounting operation according to the mounting sequence based on captured image data of board recognition camera 47 or the first and second component recognition cameras 51 and 52, detection data of a sensor that is omitted from the drawings, and the like. In addition, the control device sequentially collects and updates operation data of a production number of completely produced first and second boards K1 and K2, mounting time that is necessary for component mounting, the number of times that a component collection error occurs, and the like.

Next, the operation mode when the first and second boards K1 and K2 are produced by component mounting machine 1 will be described. The operation mode of component mounting machine 1 is varied, and an alternate production mode and an independent production mode in the present description will be described.

In the alternate production mode, first, the first board conveyance device 21 is positionally aligned at the first mounting execution position 261 at which the first board K1 is loaded. Next, both of the first component transfer device 41 and the second component transfer device 42 perform the component mounting operation on the first board K1. At this time, both mounting heads 46 are controlled so as not to interfere above the first board K1. Ordinarily, when one mounting head 46 mounts the component on the first board K1, the other mounting head 46 collects the component from feeder device 33. Then, after the one mounting head 46 finishes mounting and faces feeder device 33 for collection of the subsequent component, in substitution, the other mounting head 46 proceeds to the first board K1 and starts component mounting. Hereinafter, the first and second component transfer devices 41 and 42 alternately repeat component mounting.

The second board conveyance device 22 is positionally aligned at the second mounting execution position 262 at which the second board K2 is loaded while the first and second component transfer devices 41 and 42 perform the component mounting operation on the first board K1. When the component mounting operation on the first board K1 ends, the first and the second component transfer devices 41 and 42 perform the component mounting operation on the second board K2. The first board conveyance device 21 unloads the first board K1 completely mounted with components and loads and positionally aligns the subsequent first board K1 during the component mounting operation on the second board K2. Furthermore, when the component mounting operation on the second board K2 ends, the first and the second component transfer devices 41 and 42 perform the component mounting operation on the first board K1. The second board conveyance device 22 carries out the second board K2 of the completely mounted component during the component mounting operation on the first board K1 and loads and positionally aligns the subsequent second board K2.

In this manner, in the alternate production mode, both of the first and the second component transfer devices 41 and 42 perform the component mounting operation on one board. Thereby, the first board K1 and the second board K2 are alternately produced. Accordingly, production speed of the first board K1 and the second board K2 match as a general rule. Note that, the first board K1 and the second board K2 may be the same type or different types.

Meanwhile, in the independent production mode, when the first board conveyance device 21 is positionally aligned at the first mounting execution position 261 at which the first board K1 is loaded, the first component transfer device 41 performs the component mounting operation on the first board K1. When the component mounting operation ends, the first board conveyance device 21 unloads the first board K1 of the completely mounted component and loads the subsequent first board K1. The first component transfer device 41 is in a standby state while the first board conveyance device 21 performs unloading and loading of the first board K1. When the subsequent first board K1 is positionally aligned, the first component transfer device 41 performs the component mounting operation.

When the production of the first board K1 is performed in parallel and the second board conveyance device 22 loads the second board K2 and positionally aligns at the second mounting execution position 262, the second component transfer device 42 performs the component mounting operation on the second board K2. When the component mounting operation ends, the second board conveyance device 22 unloads the second board K2 completely mounted with components and loads the subsequent second board K2. The second component transfer device 42 is in a standby state while the second board conveyance device 22 performs unloading and loading of the second board K2. When the subsequent second board K2 is positionally aligned, the second component transfer device 42 performs the component mounting operation.

In this manner, in the independent production mode, the first component transfer device 41 performs component mounting operation on the first board K1 and the second component transfer device 42 performs component mounting operation on the second board K2. Thereby, the first board K1 and the second board K2 are produced independently from each other. Accordingly, production speed of the first board K1 and the second board K2 may not match. Note that, the first board K1 and the second board K2 may be the same type or different types.

2. Thermal Correction Process Summary

Here, Y-axis slider 44, head holder 45, and mounting head 46 of the first component transfer device 41 are equivalent to the movable section. In addition, the X-axis servomotor, the X-axis ball screw feed mechanism, the Y-axis servomotor, and the Y-axis ball screw feed mechanism are equivalent to the XY driving mechanism. Hereinafter, a member that is influenced in the component mounting operation by thermal deformation out of the movable section and the XY driving mechanism is referred to as a configuring member. When the first component transfer device 41 operates, frictional heat is generated by friction between configuring members. In addition, electric heat loss is generated in the configuring members such as the X-axis and Y-axis servomotors or the electrical component that is omitted from the drawings. The movable section and the XY driving mechanism become hotter and thermally deform by heat generation of the configuring members. Due to the thermal deformation, for example, an error may be generated in a mounting coordinate value of the components on the first board K1 and the position of component pickup section 36 of feeder device 33 may be deviated.

The control device performs thermal correction processing in order to reduce the influence of thermal deformation on the component mounting operation of the first and second component transfer devices 41 and 42 accompanying a change in temperature of the configuring member (at least one of the movable section and the XY driving mechanism). For example, thermal correction processing moves mounting head 46 to the predetermined position, imaging is performed by board recognition camera 47 and imaging is performed by the first component recognition camera 51, and data processing is executed on the acquired captured image data.

For example, as a specific method of thermal correction processing, it is possible to use the technique of Japanese Patent No. 4418014 acquired by this applicant. This patent discloses a calibration method when mounting head 46 is replaced, and is also able to be applied to thermal correction processing in which the influence of thermal deformation is reduced. In the thermal correction processing, origin correction or pitch correction of the XY coordinate system that references the XY driving mechanism, separation distance correction of mounting head 46 and board recognition camera 47, and the like are performed. Note that, the pitch correction is correction of the conversion relationship between the amount of rotation of the X-axis servomotor and the Y-axis servomotor and the movement amount of mounting head 46.

3. Temperature Rank, Permissible Time, and the Like Used in Determination of Implementation Period of Thermal Correction Processing In order to perform thermal correction processing, the control device has the functions of an implementation period determination section and a thermal correction implementation section. The implementation period determination section individually determines the implementation period of the thermal correction processing that relates to the first and second component transfer devices 41 and 42 based on the operation circumstances of the first and second component transfer devices 41 and 42. When it is determined that the implementation period of thermal correction processing is reached related to either of the first or second component transfer device 41 or 42 by the implementation period determination section, the thermal correction implementation section simultaneously performs the thermal correction processing related to the first and second component transfer devices 41 and 42. The component transfer devices will be described below in detail in relation to the functions of the implementation period determination section and the thermal correction implementation section.

Figures 2, 3:
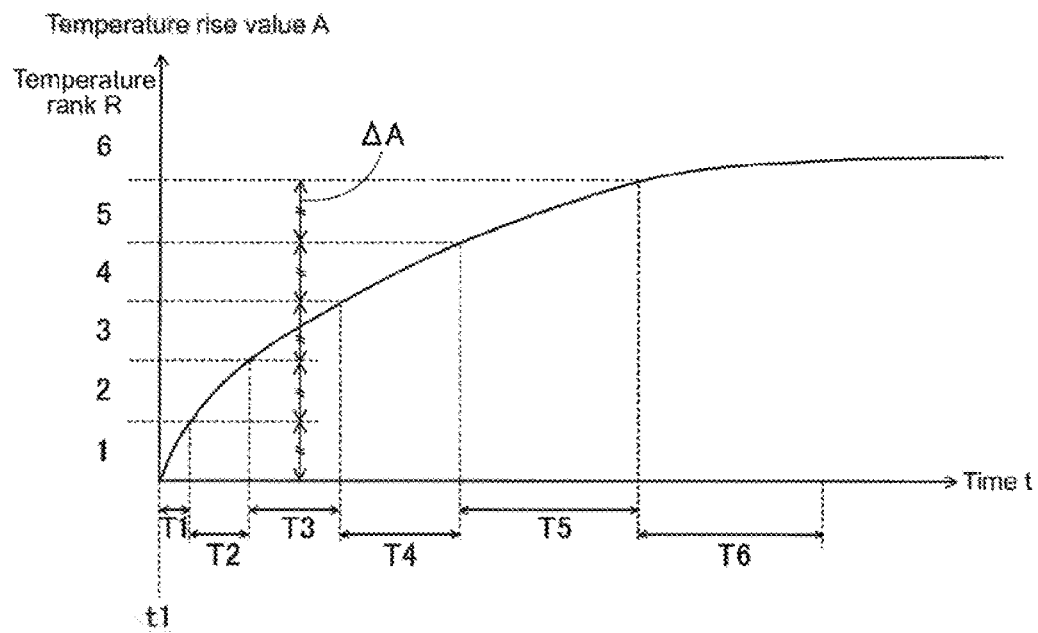
FIG. 2 is a diagram that schematically indicates a temperature rise characteristic of a configuring member of the component transfer devices (at least one of a movable section and an XY driving mechanism).
FIG. 3 is a diagram of a thermal correction up table with example permissible times and rank operations that correspond to temperature ranks of the component transfer devices.

FIG. 2 schematically indicates a temperature rise characteristic of a configuring member of component transfer devices 41 and 42. The horizontal axis in FIG. 2 represents time t and the vertical axis represents a temperature rise value A of the configuring member. Component transfer devices 41 and start operating at time t1 and continuously operate thereafter. As illustrated, after component transfer devices 41 and 42 start to operate, the temperature of the configuring member rises with a steep gradient. After that, the gradient of the temperature rise gradually becomes gentle as the operating time gets longer and finally settles at a stable temperature rise value. Typically, it is possible to express the temperature rise characteristic by a formula that uses a thermal time constant if a heat generation amount and a heat dissipation condition are fixed.

Here, the size of thermal deformation of the configuring member is roughly proportional to the size of the amount of temperature change. For example, a thermal expansion amount of the configuring member is obtained with good precision by multiplying an amount of temperature increase by a coefficient of thermal expansion of the configuring member. Therefore, the implementation period of the thermal correction process is appropriate when the size of the thermal deformation (thermal expansion amount) after the thermal correction processing of the previous time reaches the fixed amount, in other words, when the temperature rise value A increases by the fixed amount $\Delta A$. In the embodiment, the temperature rise value A is demarcated in sets of a fixed amount $\Delta A$ and sets a temperature rank R (=1 to 6) that represents the temperature rise value A in steps.

That is, if the temperature rise value A is 0 or more, a range of less than $\Delta A$ is set as the temperature rank R=1. In the same manner, if the temperature rise value A is $\Delta A$ or more, a range of less than $2\Delta A$ is set as the temperature rank R=2, and if the temperature rise value A is $4\Delta A$ or more, a range of less than $5\Delta A$ is set as the temperature rank R=5.

In addition, the temperature rise value A is saturated when exceeding 5ΔA, and does not reach 6ΔA. Accordingly, a range for the temperature rise value A of 5ΔA or more is set as the temperature rank R=6.

In addition, permissible times T1 to T6 are set to be short on the small side of the temperature rise value A and to be long on the large side of the temperature rise value A corresponding to each temperature rank R based on the temperature rise characteristic in FIG. 2. That is, the time T1 that is necessary for the temperature rise value A to increase from 0 to ΔA that corresponds to the temperature rank R=1 is the permissible time T1 that is set to temperature rank R=1. In the same manner below, the time T2 that is necessary for the temperature rise value A to increase from ΔA to 2ΔA is the permissible time T2 that is set to temperature rank R=2 and the time T5 that is necessary for the temperature rise value A to increase from 4ΔA to 5ΔA is the permissible time T5 that is set to temperature rank R=5. In addition, the permissible time T6 with temperature rank R=6 is set to the permissible time T5 or more with the meaning of confirming that the temperature rise value A is almost stable. A size relationship of permissible times T1 to T6 is represented by the following expression. T1<T2<T3<T4<T5≤T6

The permissible times T1 to T6 indicate an upper limit of the operation time in which an increase of the temperature rise value A at each temperature rank R does not reach the fixed amount ΔA. For example, when the component transfer devices 41 and 42 are in the state of temperature rank R=3 during operation, the temperature rise value A is in a range of 2ΔA or more to less than 3ΔA. Then, even if the component transfer devices 41 and 42 continue operation for the permissible time T3, the increase of the temperature rise value A is the fixed amount ΔA or less.

In addition, excluding the temperature rank R=6 on the highest temperature side, when the component transfer devices 41 and 42 operate across the permissible times T1 to T5 in the state of each temperature rank R=1 to 5, the amount of increase of the temperature rise value A is close to the fixed amount ΔA. Accordingly, it is appropriate to consider the temperature rank R to be in a state of being one rank up while carrying out thermal correction processing for the component transfer devices 41 and 42. In this manner, the feature of performing the thermal correction processing based on the increase amount of the temperature rise value A and performing a rank operation in which an operation is performed to increase the temperature rank R is specified in the control flow of the control device which will be described later.

FIG. 3 is a diagram of a thermal correction up table of example permissible times T1 to T6 and rank operations that correspond to temperature ranks R=1 to 6 of the component transfer devices 41 and 42. In the example, the permissible time T1=5 minutes, the permissible time T2=10 minutes, the permissible time T3=15 minutes, the permissible time T4=20 minutes, the permissible time T5=30 minutes, and the permissible time T6=30 minutes. In addition, the increase operation that raises the temperature rank R up by one rank is set as the rank operation when operating across the permissible times T1 to T5 in the state of the temperature ranks R=1 to 5.

Figures 4, 5:
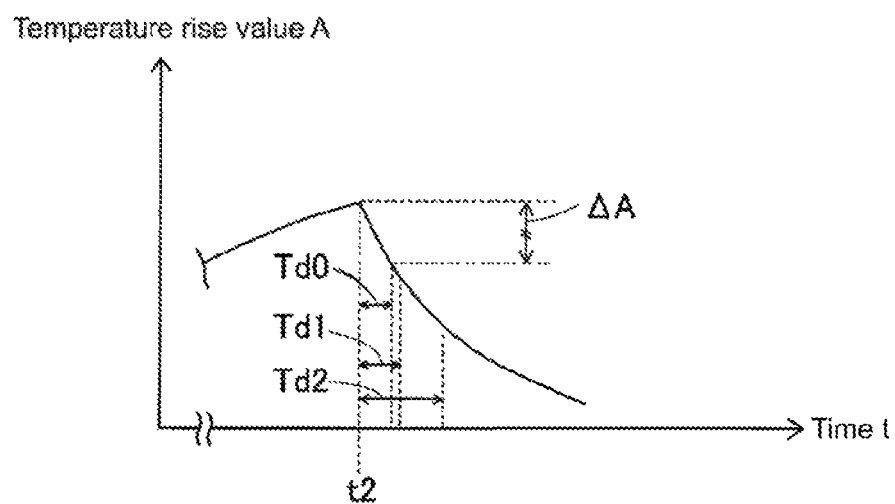
FIG. 4 is a diagram that schematically indicates a temperature drop characteristic of a configuring member of the component transfer device (at least one of the movable section and the XY driving mechanism).
FIG. 5 is a diagram of a thermal correction down table with examples of the rank operation that performs a reduction operation of the temperature rank according to the length of a stopped duration of the component transfer devices.

FIG. 4 schematically indicates a temperature drop characteristic of a configuring member of the component transfer devices 41 and 42. The horizontal axis in FIG. 4 represents time t and the vertical axis represents a temperature rise value A of the configuring member. The component transfer devices 41 and 42 continue to operate and stop at the time t2. As illustrated, after the component transfer devices 41 and 42 stop operating, the temperature of the configuring member lowers with a steeper gradient than when the temperature rises. That is, the thermal time constant when the temperature lowers is smaller than the thermal constant when the temperature rises.

In the present embodiment, a predetermined time Td0 is used as a standard in which a thermal contraction amount of the configuring member is a fixed amount, in other words, an amount of reduction of the temperature rise value A is the fixed amount ΔA. Thereby, when the stopped duration is the predetermined time Td0 or more after the component transfer devices 41 and 42 stop operating, it is possible to determine that the implementation period of the thermal correction processing for the component transfer devices 41 and 42 is reached. Furthermore, it is appropriate to perform a reduction operation of multiple ranks or one rank on the temperature rank R of the component transfer devices 41 and 42 according to the length of the stopped duration. A first threshold time Td1 and a second threshold time Td2 that are larger than the predetermined time Td0 are set as the threshold time that determines the reduced rank number. In this manner, the feature of performing the thermal correction processing based on the reduction amount of the temperature rise value A and performing a rank operation in which a reduction operation is performed to reduce the temperature rank R is specified in the control flow of the control device which will be described later.

FIG. 5 is a diagram of a thermal correction down table with examples of the rank operation that performs a reduction operation of the temperature rank R according to the length of a stopped duration of the component transfer devices 41 and 42. In the example, the predetermined time Td0=3 minutes, the first threshold time Td1=5 minutes, and the second threshold time Td2=10 minutes. Then, when stopped duration T11 of the component transfer devices 41 and 42 is less than the predetermined time Td0 (=3 minutes), the temperature rank R is set to not be modified. When stopped duration T12 is less than the first threshold time Td1 (=5 minutes) at the predetermined time Td0 (=3 minutes) or more, the temperature rank R is set to be lowered by one rank. When stopped duration T13 is less than the second threshold time Td2 (=10 minutes) at the first threshold time Td1 (=5 minutes) or more, the temperature rank R is set to be lowered by two ranks. Furthermore, when stopped duration T14 is the second threshold time Td2 (=10 minutes) or more, the temperature rank is set to return to R=1.

Note that, the temperature rise value A at the time t2 at which the component transfer devices 41 and 42 are stopped is uncertain. Therefore, the amount of reduction of the temperature rise value A that is generated until the predetermined time Td0, the first threshold time Td1, and the second threshold time Td2 have elapsed is uncertain. Considering the uncertainty, the reduction operation of the temperature rank R is set to lower the temperature rank R. Then, using the temperature rank R that is lower than the actual temperature rise value A of the component transfer devices 41 and 42 has the meaning of lowering the permissible times T1 to T6. The implementation period of the thermal correction processing is hastened and there is a stable side from the viewpoint of reducing influence of thermal deformation.

4. Control Flow Related to Thermal Correction Processing)

Figure 6:
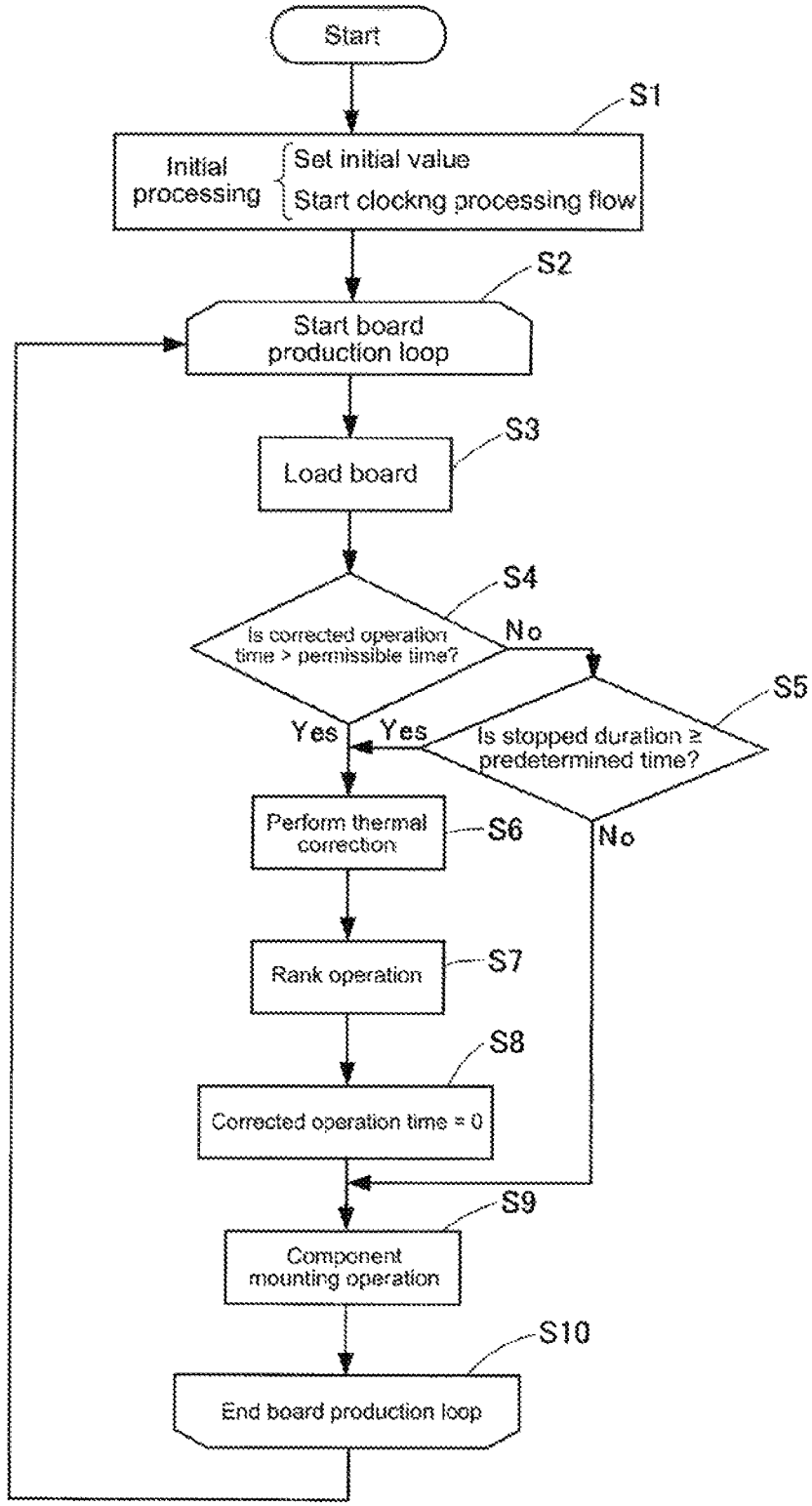
FIG. 6 is a diagram that indicates a control flow of the thermal correction processing which the control device performs.

Next, a control method of the thermal correction process which the control device performs will be described. FIG. 6 indicates a control flow of the thermal correction processing that the control device performs. In addition, FIG. 7 indicates a clocking process flow that is performed in parallel with the control flow in FIG. 6. A case is considered in which component mounting machine 1 is assumed to operate in the alternate production mode.

In step S1 in FIG. 6, the control device performs initial value setting as an initial process directly after being started by the component mounting machine 1 and the clocking process flow starts. In the initial value setting, the first temperature rank R1=1 of the first component mounting machine 41 and the second temperature rank R2=1 of the second component mounting machine 42 are initially set. Furthermore, a first corrected operation time tm1=0 of the first component mounting machine 41 and the first stopped duration ts1=0 are initially set, and a second corrected operation time tm2=0 of the second component mounting machine 42 and the second stopped duration ts2=0 are initially set. The first and second corrected operation times tm1 and tm2 are times at which the respective operations of the first and second component transfer devices 41 and 42 continue after the thermal correction processing is performed. However, only directly after the component mounting machine 1 is started, the time is used at which the operation continues after starting operation as the first and second corrected operation times tm1 and tm2.

Figure 7:
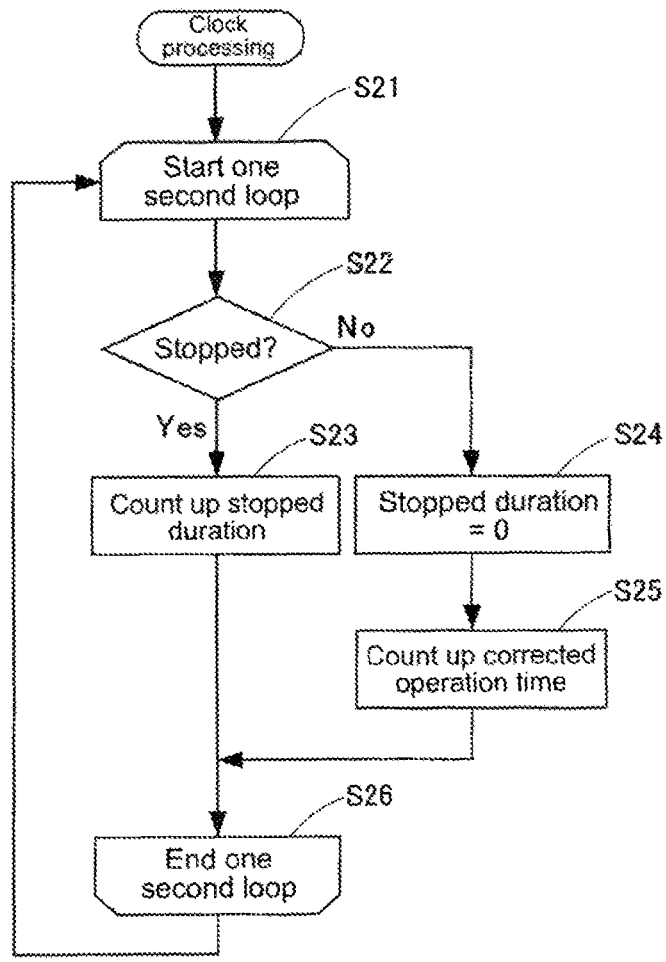
FIG. 7 is a diagram that indicates a clocking process flow that is performed in parallel with the control flow in FIG. 6.

In addition, the control device performs a clocking process flow that is performed in parallel with the control flow in FIG. 6. That is, the control device performs a process of a one second loop from step S21 to step S26 that are indicated in FIG. 7 once in one second. However, since there are cases where there are differences in the operation circumstances in the first component transfer device 41 and the second component transfer device 42, the control device performs the process of one second loop individually for the first and second component transfer devices 41 and 42.

In step S22, the control device determines whether the first component transfer device 41 is stopped. The control device advances to step S23 in which the clocking process flow is performed when stopped and advances to step S24 in which the clocking process flow is performed when operated. In step S23, the control device ends the one second loop by counting up the first stopped duration ts1 by one second. In step S24, the control device resets the first stopped duration ts1 to zero and advances to step S25 in which the clocking process flow is performed. In step S25, the control device ends the one second loop by counting up the first corrected operation time tm1 by one second.

The control device computes the second stopped duration ts2 and the second corrected operation time tm2 by performing the process in the same one second loop as the second component transfer device 42.

Returning to FIG. 6, the control device repeatedly performs a board production loop from step S2 to step S10 after the initial process of step S1. In step S3, the control device loads and positionally aligns the first board K1 or the second board K2. In step S4, the control device determines whether the first corrected operation time tm1 that is computed by the clocking process flow exceeds the permissible time that is set to the current first temperature rank R1 of the first component transfer device 41. In the same manner, the control device determines whether the second corrected operation time tm2 exceeds the permissible time that is set to the current second temperature rank R2 of the second component transfer device 42. The control device advances performance of the control flow to step S6 when at least one is exceeded and advances performance of the control flow to step S5 in other cases.

In step S5, the control device determines whether the first stopped duration ts1 and the second stopped duration ts2 that are computed by the clocking process flow reach the predetermined time Td0. The control device advances performance of the control flow to step S6 when at least one reaches the predetermined time Td0 and advances performance of the control flow to step S9 in other cases. In step S6, the control device simultaneously executes the thermal correction processing on the first component transfer device 41 and the second component transfer device 42.

In step S7, the control device performs rank operation based on the determined condition when advancing to step S6. That is, in step S4, the control device performs an increase operation of one rank on both of the first temperature rank R1 and the second temperature rank R2 in a case where both the first corrected operation time tm1 and the second corrected operation time tm2 exceed the permissible time. In step S4, the control device performs the increase operation of one rank on only the temperature rank R of the exceeded component transfer device in a case where only one of the first corrected operation time tm1 and the second corrected operation time tm2 exceed the permissible time.

In addition, in step S5, the control device performs a lowering operation on both of the first temperature rank R1 and the second temperature rank R2 in a case where both of the first stopped duration ts1 and the second stopped duration ts2 exceed the predetermined time Td0. In step S5, the control device performs the lowering operation on the temperature rank R on the side that reaches the predetermined time Td0 in a case where only one of the first stopped duration ts1 and the second stopped duration ts2 exceed the predetermined time Td0. Note that, the rank number of the lowering operation is set according to the thermal correction down table in FIG. 5.

In step S8, the control device resets the first corrected operation time tm1 and the second corrected operation time tm2 to zero. In this case, in the component transfer device in which the thermal correction processing is performed due to reaching the thermal correction period, the relationship between the temperature rise value A and the temperature rank R is roughly indicated in FIG. 3. Meanwhile, the thermal correction processing is simultaneously performed due to reaching the thermal correction period of the component transfer device on the opposite side, and the component transfer device is generated in which the corrected operation time that is not reached in the permissible time is reset. Then, thereafter, in the component transfer device, it is possible for the temperature rank R that corresponds to the temperature rise value A to be lower than the rank that is indicated in FIG. 3. Even so, using the temperature rank R that is lower than the actual temperature rise value A of the component transfer devices has the meaning of lowering the permissible times T1 to T6. The implementation period of the thermal correction processing is hastened and there is a stable side from the viewpoint of reducing influence of thermal deformation.

In step S9, the control device controls the component mounting operation that is performed by the first and second component transfer devices 41 and 42 with respect to the positionally aligned first board K1 or the second board K2. Thereby, production of one board is complete. The control device returns the performance of the control flow from step S10 to step S2 and proceeds to production of the subsequent board.

The function of step S6 in the control flow in FIG. 6 is equivalent to the thermal correction implementation section of the present disclosure. In addition, the function of other steps than step S6 in the control flow and the function of the clocking process flow in FIG. 7 are equivalent to the implementation period determination section of the present disclosure.

5. Actions of Component Mounting Machine 1 of Embodiment

Figure 8:
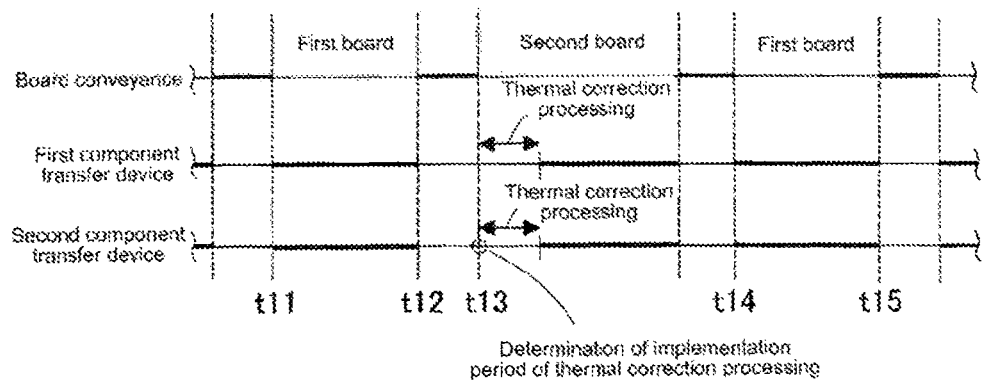
FIG. 8 is a diagram of a time chart that illustrates an operation of the component mounting machine of the embodiment.
Figure 9:
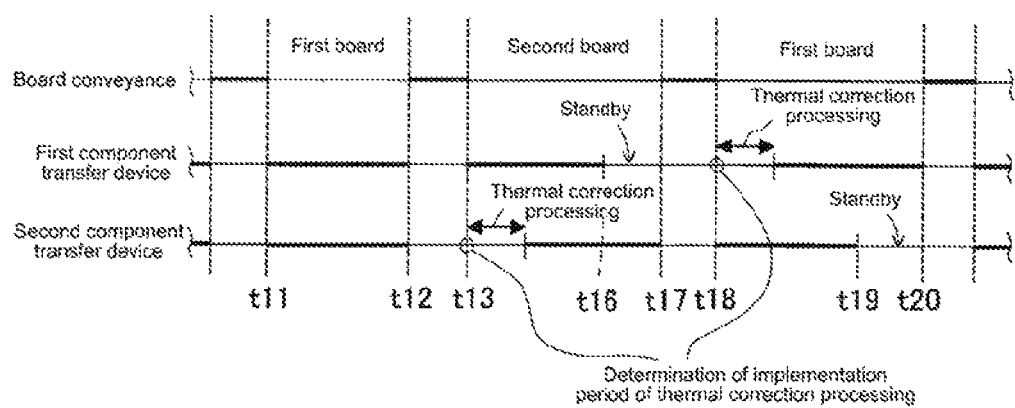
FIG. 9 is a diagram of a time chart that illustrates an action of a component mounting machine of a technology of the related art.

Next, actions of component mounting machine 1 of the embodiment will be described in comparison to techniques of the related art. FIG. 8 is a diagram of a time chart that describes actions of component mounting machine 1 of the embodiment. FIG. 9 is a diagram of a time chart that describes an operation of a component mounting machine of a technology of the related art. In FIG. 8 and FIG. 9, an upper stage line indicates a board conveyance operation, a middle stage line indicates the component mounting operation of the first component transfer device 41, and a lower stage line indicates the component mounting operation of the second component transfer device 42.

In the embodiment indicated in FIG. 8, the component mounting operation is performed on the first board K1 in a time slot of the time t11 to the time t12. Then, it is determined that the implementation period of the thermal correction processing for the second component transfer device 42 is reached at time t13 directly after the first board K1 completely mounted with components is unloaded and the second board K2 is loaded. By doing this, as illustrated, the thermal correction processing of the first and the second component transfer devices 41 and 42 are simultaneously performed. Therefore, lost time is generated where the thermal correction processing is performed by interrupting the component mounting operation using the first and second component transfer devices 41 and 42. After that, the component mounting operation is performed on the subsequent first board K1 without performing the thermal correction processing in a time slot of time t14 to time t15.

In a technique in the related art that is indicated in FIG. 9, the implementation period of the thermal correction process related to the second component transfer device 42 is determined and the thermal correction process is performed at the time t13 directly after the second board K2 is loaded. In the second component transfer device 42, the component mounting operation of the first component transfer device 41 precedes since the component mounting operation is interrupted during the thermal correction processing. The first component transfer device 41 ends the component mounting operation at time t16, and the second component transfer device 42 ends the component mounting operation at delayed time t17. From time t16 to t17, the first component transfer device 41 is in standby and lost time is generated.

Furthermore, the implementation period of the thermal correction processing for the first component transfer device 41 is determined and the thermal correction processing is performed at time t18 directly after the subsequent first board K1 is carried in. Thereby, now, the component mounting operation of the second component transfer device 42 precedes. The second component transfer device 42 ends the component mounting operation at time t19, and the first component transfer device 41 ends the component mounting operation at delayed time t20. Then, from time t19 to t20, the second component transfer device 42 is in standby and lost time is generated. In this manner, in the technique in the related art, since the implementation period of the thermal correction processing is individually managed in the first and second component transfer devices 41 and 42, lost time is generated two times.

In contrast, in the embodiment, the number of times that lost time is generated is just once when the thermal correction processing is performed simultaneously. That is, according to the embodiment, it is also possible to reduce lost time that is generated by the thermal correction processing by the technique in the related art.

In addition, in a case where the component mounting machine 1 of the embodiment operates in the independent production mode, when it is determined that the implementation period of the thermal correction processing is reached for either of the component transfer devices by the implementation period determination section, the thermal correction implementation section performs only the thermal correction processing for the corresponding component transfer device. That is, in the independent production mode, it is possible to consider separate component mounting machines that are independent on the first side and the second side since the first and second component transfer devices 41 and 42 perform the component mounting operation unrelated to the thermal correction processing on the opposite side. Thereby, it is possible to perform the thermal correction processing as per the set permissible time by individually performing a rank operation in FIG. 3 and FIG. 5 without the first and second component transfer devices 41 and 42 interfering with each other.

6. Effects of Component Mounting Machine 1 of Embodiment

Component mounting machine 1 of the embodiment is provided with the first and second component transfer devices 41 and 42 that each have a mounting nozzle that holds and releases a component, a movable section (Y-axis slider 44, head holder 45, and head 46) that supports the mounting nozzle, and an XY driving mechanism that drives the movable section in the X-axis direction and the Y-axis direction in the horizontal plane and performs the component mounting operation for mounting the component that is collected from the first and second component supply devices 31 and 32 on the positionally aligned first board K1 and the second board K2, and a control device that controls the component mounting operation that is performed by the first and second component transfer devices 41 and 42 on one of the first board K1 and the second board K2 that are sequentially positionally aligned by the first and second board conveyance devices 21 and 22 (case of the alternate production mode) and performs the thermal correction processing that reduces influence of thermal deformation on the component mounting operation of each of the component transfer devices 41 and 42 accompanying temperature change of at least one of the movable section and the XY driving mechanism, in which the control device has the implementation period determination section that individually determines the implementation period of the thermal correction processing for each of the component transfer devices 41 and 42 based on operation circumstances of each component transfer device 41 and 42, and the thermal correction implementation section that simultaneously performs the thermal correction processing for the first and second component transfer devices 41 and 42 when it is determined that the implementation period of the thermal correction process is reached for either of the component transfer devices 41 and 42 by the implementation period determination section.

Thereby, when it is determined that the implementation period of the thermal correction processing has been reached for either of the component transfer devices 41 and 42 by the implementation period determination section, the thermal correction implementation section simultaneously performs the thermal correction processing for the first and second component transfer devices 41 and 42. Therefore, lost time where the thermal correction processing is performed by interrupting the component mounting operation using the first and second component transfer devices 41 and 42 overlaps and ends in one time. Meanwhile, when the implementation period of the thermal correction process by a technique in the related art is individually managed in multiple component transfer devices, lost time is generated multiple times. Accordingly, according to the present embodiment, lost time is reduced and it is possible to suppress reduction of production efficiency.

Furthermore, in component mounting machine 1 of the embodiment, the implementation period determination section sets the permissible times T1 to T6 that are longer, the larger the temperature rise value A of at least one of the movable section and the XY driving mechanism when the thermal correction processing is performed for one of the component transfer device 41 or 42, and determines that the implementation period of the subsequent thermal correction processing is reached when the corrected operation times tm1 and tm2 at which the operation continues after the thermal correction processes is performed match the permissible times T1 to T6.

Thereby, it is possible to perform the subsequent thermal correction processing prior to the amount of increase of the temperature rise value A becoming excessive after the thermal correction processing is performed for the component transfer devices 41 and 42. Accordingly, timely thermal correction processing is performed prior to influence of the thermal deformation of the configuring member becoming excessive. It is possible to reduce the number of times that the thermal correction processing is performed and it is possible to curtail reductions in production efficiency compared with the technique in the related art in which the thermal correction process is performed at a defined time with an even gap.

Furthermore, in component mounting machine 1 of the embodiment, the implementation period determination section uses the temperature rank R (R1 and R2) that represents insteps the temperature rise value A of at least one of the movable section and the XY driving mechanism of the component transfer devices 41 and 42 and the permissible times T1 to T6 that are set in steps to be short on the small side of the temperature rise value A and to be long on the large side of the temperature rise value corresponding to the temperature rank R (R1 and R2), and performs the increase operation of one rank of the temperature rank R (R1 and R2) of one of the component transfer devices 41 and 42 when the thermal correction implementation section performs the thermal correction processing for one of the component transfer devices 41 and 42.

Thereby, the subsequent thermal correction processing is performed in a timely manner when the temperature rise value A changes by the fixed amount ΔA after the thermal correction processing is performed for the component transfer devices 41 and 42. Accordingly, it is possible to perform the thermal correction processing when the size of the thermal deformation of the configuring member reaches the fixed amount and maintain influence of the thermal deformation to the fixed amount or less. It is possible to substantially reduce the number of times that the thermal correction processing is performed by combining the temperature rank R and the permissible times T1 to T6 and an effect of suppressing reduction of production efficiency is remarkable compared with the technique in the related art in which the thermal correction processing is performed at a defined time with an even gap.

Furthermore, in component mounting machine 1 of the embodiment, the implementation period determination section determines that the implementation period of the thermal correction processing is reached when the stopped durations ts1 and ts2 after operation is stopped are the predetermined time Td0 or more with respect to one component transfer device 41 or 42 and furthermore, performs the reduction operation of multiple ranks or one rank on the temperature rank R according to the length of the stopped durations ts1 and ts2.

Thereby, it is possible to perform the thermal correction processing in a timely manner prior to the component transfer devices 41 and 42 stopping and influence of the thermal deformation (thermal contraction) of the configuring member becoming excessive. Even if the operation and the stopping of the component transfer devices 41 and 42 occur irregularly, it is possible to determine the implementation period of the thermal correction processing such that there is a stable side from the viewpoint of reducing influence of thermal deformation.

Furthermore, in component mounting machine 1 of the embodiment, the implementation period determination section determines that the implementation period of the thermal correction processing for one component transfer device (41 or 42) is reached and determines that the implementation period of the thermal correction processing for the other component transfer device (41 or 42) is not reached, and in a case where the thermal correction implementation section simultaneously performs the thermal correction processing for the one component transfer device (41 or 42) and the other component transfer device (42 or 41), the implementation period determination section maintains the temperature rank R of the other component transfer device (42 or 41).

Thereby, the temperature rank R of the other component transfer device (42 or 41) is maintained when the thermal correction processing is performed for the other component transfer device (42 or 41) that has yet to reach the implementation period in combination with the implementation period of the thermal correction processing related to the one component transfer device (41 or 42). Therefore, the temperature rank R of the other component transfer device (42 or 41) is optimized or lowered, and there is a stable side from the viewpoint of reducing the influence of thermal deformation.

Furthermore, in component mounting machine 1 of the embodiment, in the case of the independent production mode in which the first and second component transfer devices 41 and 42 perform the component mounting operation with respect to the respective boards, when it is determined that the implementation period of the thermal correction processing is reached for either of the component transfer devices 41 or 42 by the implementation period determination section, the thermal correction implementation section performs only the thermal correction processing for the corresponding component transfer devices 41 and 42.

Thereby, it is possible to individually determine and perform the implementation period of the thermal correction processing without the first and second component transfer devices 41 and 42 interfering with each other. Accordingly, the implementation period is reliably optimized in each of the first and second component transfer devices 41 and 42.

Note that, the temperature rank R of the temperature rise value A in the embodiment has six steps, but is not limited thereto. For example, in a case where particularly high precision is required in the component mounting operation, preferably the fixed amount ΔA is set to be small and the number of steps of the temperature rank R increases. In addition, the permissible times T1 to T6 during the temperature rise, the predetermined time Td0 during the temperature lowering, the first threshold time Td1, and the second threshold time Td2 are schematic examples, and preferably are appropriately set based on the requested precision of the thermal characteristics and the component mounting operation of the component transfer devices 41 and 42.

Further note that, it is also possible to apply the present disclosure in a component mounting machine of a single lane dual head type that is provided with one board conveyance device and two component transfer devices 41 and 42. In addition, it is also possible to apply the present disclosure to a component mounting machine that is provided with three or more board conveyance devices and component transfer devices. Various other applications or modifications of the present disclosure are possible.

REFERENCE SIGNS LIST

1: component mounting machine; 21, 22: first and second board conveyance device; 31, 32: first and second component supply device; 41, 42: first and second component transfer device; 51, 52: first and second component recognition camera; K1, K2: first and second board; A: temperature rise value, ΔA: fixed amount; R: temperature rank; T1-T6: permissible time; Td0: predetermined time; Td1: first threshold time; Td2: second threshold time

The invention claimed is:

1. A component mounting machine comprising:
multiple component transfer devices that each have a mounting nozzle configured to hold and release a component, a movable section configured to support the mounting nozzle, and an XY driving mechanism configured to drive the movable section in an X-axis direction and a Y-axis direction in a horizontal plane, the component transfer devices each configured to perform a component mounting operation for collecting a component one by one from a component supply device and configured to mount the component on a positionally aligned board; and
a control device configured to control the component mounting operation that is performed by the multiple component transfer devices on each of multiple of boards that are sequentially positionally aligned by a board conveyance device and configured to perform thermal correction processing that reduces influence on the component mounting operation of thermal deformation of each of the component transfer devices accompanying temperature change of at least one of the movable section and the XY driving mechanism,
wherein the control device includes
an implementation period determination section configured to individually determine an implementation period of the thermal correction processing for each of the component transfer devices based on operation circumstances of each component transfer device, and
a thermal correction implementation section configured to simultaneously perform the thermal correction processing for the multiple component transfer devices when it is determined by the implementation period determination section that the implementation period of the thermal correction processing has been reached for any of the component transfer devices.

2. The component mounting machine according to claim 1,
wherein the implementation period determination section is configured to
set permissible times that are longer, the larger a temperature rise value of at least one of the movable section and the XY driving mechanism when the thermal correction processing is performed with respect to one component transfer device, and
determine that the implementation period of subsequent thermal correction processing has been reached when corrected operation times at which the operation continues after the thermal correction processing has been performed match the permissible times.

3. The component mounting machine according to claim 2,
wherein the implementation period determination section is configured to
use a temperature rank that represents in steps the temperature rise value of at least one of the movable section and the XY driving mechanism of the component transfer devices and the permissible times that are set in steps to be short on a small side of the temperature rise value and to be long on a large side of the temperature rise value corresponding to the temperature rank, and
perform an increase operation of one rank of the temperature rank of the one component transfer device when the thermal correction implementation section has performed the thermal correction processing related to the one component transfer device.

4. The component mounting machine according to claim 3,
wherein the implementation period determination section is configured to
determine that the implementation period of the thermal correction processing has been reached when a stopped duration after the operation is stopped is a predetermined time or more with respect to the one component transfer device, and
perform a reduction operation of multiple ranks or one rank on the temperature rank according to a length of the stopped duration.

5. The component mounting machine according to claim 3,
wherein in a case where the implementation period determination section determines that the implementation period of the thermal correction processing for the one component transfer device has been reached and determines that the implementation period of the thermal correction processing for another component transfer device has not been reached, and the thermal correction implementation section simultaneously performs the thermal correction processing for the one component transfer device and the another component transfer device,
the implementation period determination section is configured to maintain the temperature rank of the another component transfer device.

6. The component mounting machine according to claim 1,
wherein in a case where the multiple component transfer devices respectively perform the component mounting operation with respect to multiple of the boards separately,
when it is determined that the implementation period of the thermal correction processing has been reached for any of the component transfer devices by the implementation period determination section, the thermal correction implementation section is configured to perform only the thermal correction processing related to the corresponding component transfer device.

\* \* \* \* \*